US010468110B2

(12) United States Patent
Lee

(10) Patent No.: US 10,468,110 B2
(45) Date of Patent: Nov. 5, 2019

(54) SEMICONDUCTOR DEVICE AND OPERATING METHOD THEREOF

(71) Applicant: SK hynix Inc., Gyeonggi-do (KR)

(72) Inventor: Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/443,294

(22) Filed: Jun. 17, 2019

(65) Prior Publication Data

US 2019/0304545 A1    Oct. 3, 2019

Related U.S. Application Data

(63) Continuation of application No. 15/910,195, filed on Mar. 2, 2018.

(30) Foreign Application Priority Data

Jul. 27, 2017    (KR) .................. 10-2017-0095723

(51) Int. Cl.
| | |
|---|---|
| *G11C 16/06* | (2006.01) |
| *G11C 16/24* | (2006.01) |
| *G11C 16/08* | (2006.01) |
| *G11C 16/34* | (2006.01) |
| *G11C 16/04* | (2006.01) |
| *G11C 16/26* | (2006.01) |
| *G11C 16/30* | (2006.01) |
| *G11C 16/32* | (2006.01) |
| *G11C 16/10* | (2006.01) |
| *G11C 16/14* | (2006.01) |

(52) U.S. Cl.
CPC .......... *G11C 16/24* (2013.01); *G11C 16/0483* (2013.01); *G11C 16/08* (2013.01); *G11C 16/26* (2013.01); *G11C 16/3418* (2013.01); *G11C 16/10* (2013.01); *G11C 16/14* (2013.01); *G11C 16/30* (2013.01); *G11C 16/32* (2013.01)

(58) Field of Classification Search
CPC . G11C 16/0483; G11C 11/5642; G11C 16/24; G11C 16/26
See application file for complete search history.

(56) References Cited

U.S. PATENT DOCUMENTS

| | | | | |
|---|---|---|---|---|
| 2010/0202216 A1* | 8/2010 | Byeon | ................ | G11C 16/0483 365/185.25 |
| 2012/0269007 A1* | 10/2012 | Yang | ....................... | G11C 7/00 365/189.05 |

* cited by examiner

*Primary Examiner* — Tuan T Nguyen
(74) *Attorney, Agent, or Firm* — IP & T Group LLP

(57) ABSTRACT

A semiconductor memory device includes a cell string, a common source line controller, and a page buffer. The cell string includes a plurality of memory cells coupled in series between a common source line and a bit line. In a read operation, the common source line controller provides a channel current to the cell string through the common source line. The page buffer senses data stored in a selected memory cell among the plurality of memory cells by sensing a current of the bit line when the channel current is provided. The common source line controller precharges the bit line by providing the channel current to the cell string through the common source line. After the bit line is precharged, the page buffer senses the data stored in the selected memory cell by transmitting a voltage of the bit line to a sensing node.

15 Claims, 15 Drawing Sheets

SEMICONDUCTOR DEVICE AND OPERATING METHOD THEREOF

CROSS-REFERENCE TO RELATED APPLICATION

This application is a continuation of U.S. patent application Ser. No. 15/910,195 filed on Mar. 2, 2018, which claims benefits of priority of Korean Patent Application No. 10-2017-0095723 filed on Jul. 27, 2017. The disclosure of each of the foregoing application is incorporated herein by reference in its entirety.

BACKGROUND

Field of Invention

An aspect of the present disclosure relates to an electronic device. Particularly, the present disclosure relates to a semiconductor device and an operating method thereof.

Description of Related Art

Semiconductor devices may be formed in a two-dimensional structure in which strings are arranged horizontally to a semiconductor substrate, or be formed in a three-dimensional structure in which strings are arranged vertically to a semiconductor substrate. A three-dimensional semiconductor device is devised to overcome the limit of degree of integration in two-dimensional semiconductor devices, and may include a plurality of memory cells vertically stacked on a semiconductor substrate.

SUMMARY

Embodiments provide a semiconductor device having improved reliability of a read operation.

Embodiments also provide a read method of a semiconductor device having improved reliability.

According to an aspect of the present disclosure, there is provided a semiconductor device including: a cell string including a plurality of memory cells coupled in series between a common source line and a bit line; a common source line controller configured to provide a channel current to the cell string through the common source line in a read operation; and a page buffer configured to sense data stored in a selected memory cell among the plurality of memory cells based on a current of the bit line when the channel current is provided, wherein the common source line controller precharges the bit line with the channel current supplied to the cell string through the common source line, wherein, after the bit line is precharged, the page buffer senses the data stored in the selected memory cell based on a voltage of the bit line transmitted to a sensing node.

The page buffer may include: a bit line sensing transistor coupled between the bit line and a common node; an emission transistor coupled between the common node and a first power source; a transmission transistor coupled between the common node and the sensing node; and a power supply transistor coupled between the sensing node and a second power source. While the bit line is being precharged, the transmission transistor and the power supply transistor may be turned on in a first turn-on state, the bit line sensing transistor may be turned on in a second turn-on state, and the emission transistor may be turned off.

The page buffer may further include: a sensing transistor having a gate electrode coupled to the sensing node; a strobe transistor coupled between a first electrode of the sensing transistor and a third power source; and a latch circuit coupled to a second electrode of the sensing transistor.

According to an aspect of the present disclosure, there is provided a method for operating a semiconductor device, the method including: precharging a bit line according to a program state of a selected memory cell of a cell string by providing a channel voltage to a common source line; transmitting a voltage of the precharged bit line to a sensing node coupled to a gate electrode of a sensing transistor; and storing data of the selected memory cell in a latch circuit, based on the voltage transmitted to the sensing node.

The precharging of the bit line may include: applying a channel voltage having a positive voltage value to the common source line of the cell string; and turning on a drain select transistor and a source select transistor of the cell string in a first turn-on state.

According to an aspect of the present disclosure, there is provided a method for operating a semiconductor device, the method including: providing a channel voltage to a common source line; transmitting a voltage of a bit line according to a program state of a selected memory cell of a cell string to a sensing node coupled to a gate electrode of a sensing transistor, based on the provided channel voltage; and storing data of the selected memory cell in a latch circuit, based on the voltage transmitted to the sensing node.

DETAILED DESCRIPTION

Figure 1:
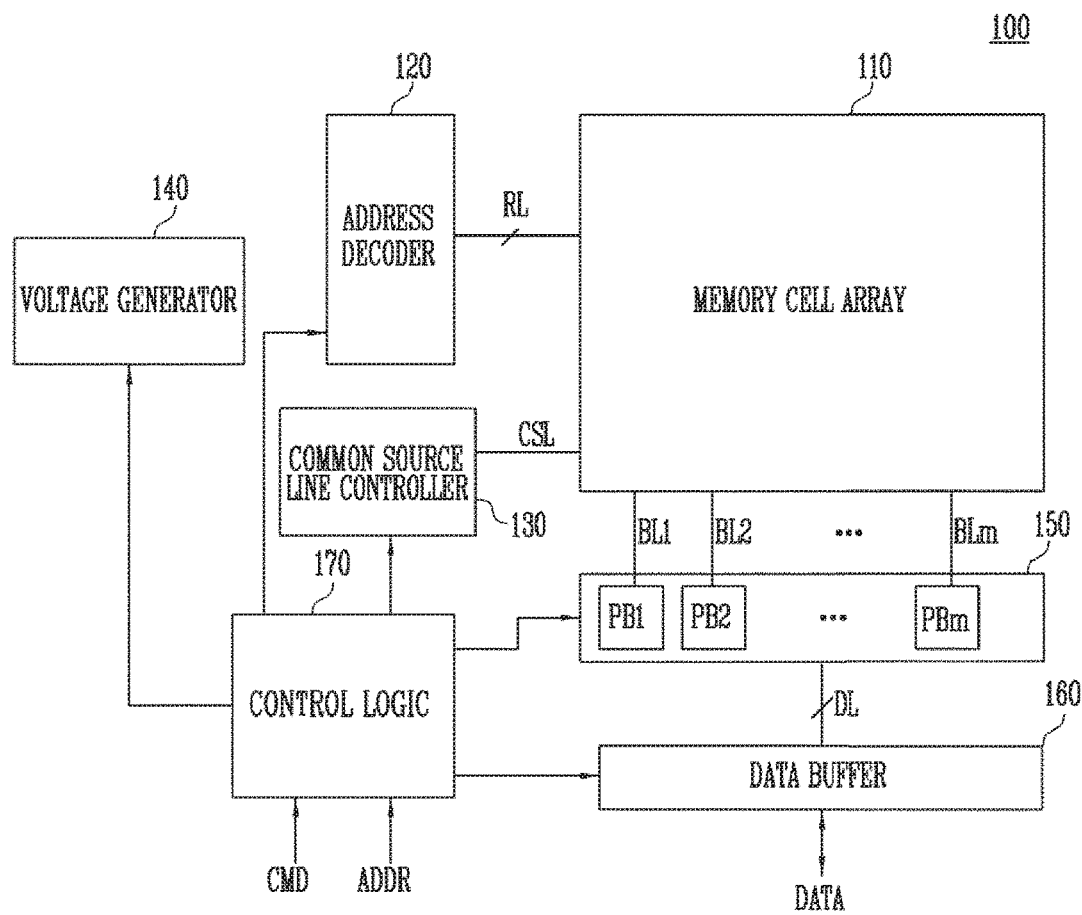
FIG. 1 is a block diagram illustrating a semiconductor device according to an embodiment of the present disclosure.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Hereinafter, exemplary embodiments of the present disclosure will be described in detail with reference to the accompanying drawings. The same reference numerals are used to designate the same elements as those shown in other drawings. In the following descriptions, only portions necessary for understanding operations according to the exemplary embodiments may be described, and descriptions of the other portions may be omitted so as to not obscure important concepts of the embodiments.

In the figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

FIG. 1 is a block diagram illustrating a semiconductor device 100 according to an embodiment of the present disclosure.

Referring to FIG. 1, the semiconductor device 100 includes a memory cell array 110, an address decoder 120, a common source line controller 130, a voltage generator 140, a read/write circuit 150, a data buffer 160, and a control logic 170.

The memory cell array 110 is coupled to the address decoder 120 through row lines RL, and is coupled to the common source line controller 130 through a common source line CSL. The memory cell array 110 is coupled to the read/write circuit 150 through bit lines BL1 to BLm.

The memory cell array 110 includes a plurality of memory blocks. Each of the plurality of memory blocks may include a plurality of cell strings.

In an embodiment, each of the plurality of cell strings may include a plurality of memory cells arranged or stacked above a substrate. The plurality of memory cells may include volatile and/or nonvolatile memory cells. In an embodiment, each of the plurality of memory cells may be defined as a single level cell or a multi-level cell. The memory cell array 110 will be described in more detail with reference to FIGS. 2 to 4.

The address decoder 120 is coupled to the memory cell array 110 through the row lines RL. The row lines RL include drain select lines, word lines, and source select lines. In an embodiment, the row lines RL may further include a pipe select line.

The address decoder 120 operates in response to the control of the control logic 170. The address decoder 120 is configured to receive an address ADDR from the control logic 170 and drive the row lines RL according to the received address ADDR.

In an embodiment, the address ADDR includes a block address and a row address in a read operation. The address decoder 120 is configured to decode the block address in the received address ADDR. The address decoder 120 selects one memory block according to the decoded block address. The address decoder 120 is configured to decode the row address in the received address ADDR. The address decoder 120, according to the decoded row address, applies a read voltage provided from the voltage generator 140 to a selected word line of the selected memory block, and applies a pass voltage provided from the voltage generator 140 to unselected word lines of the selected memory block.

The address decoder 120 may include a block decoder, a row decoder, an address buffer, and the like.

The common source line controller 130 is configured to control the common source line CSL in response to the control of the control logic 170. The common source line controller 130 may provide a channel current to the common source line CSL in various operations including a read operation. As the channel current is provided, the common source line CSL has a positive voltage.

The voltage generator 140 is configured to generate a plurality of voltages by using an external voltage supplied to the semiconductor device 100. The voltage generator 140 operates in response to the control of the control logic 170.

In an embodiment, the voltage generator 140 may include a circuit that generates a power voltage by regulating an external voltage. In an embodiment, the voltage generator 140 may include a plurality of pumping capacitors, and generate a plurality of voltages by selectively activating the plurality of pumping capacitors that receive a power voltage. The generated voltages may be provided to the address decoder 120, the common source line controller 130, the read/write circuit 150, the data buffer 160, and the control logic 170.

The read/write circuit 150 is coupled to the memory cell array 110 through the bit lines BL1 to BLm. The read/write circuit 150 operates in response to the control of the control logic 170.

The read/write circuit 150 includes first to m-th page buffers PB1 to PBm respectively coupled to first to m-th bit lines BL1 to BLm. In a read operation, the first to m-th page buffers PB1 to PBm are configured to read data of memory cells coupled to a selected word line (hereinafter, referred to as selected memory cells) by respectively sensing currents of the first to m-th bit lines BL1 to BLm. The read/write circuit 150 provides the read data DATA to the data buffer 160 through data lines DL.

In an embodiment, the read/write circuit 150 may further include a column select circuit.

The data buffer 160 is coupled to the read/write circuit 150 through the data lines DL. The data buffer 160 operates in response to the control of the control logic 170. The data buffer 160 may output the data DATA provided from the read/write circuit 150 to the outside.

The control logic 170 is coupled to the address decoder 120, the common source line controller 130, the voltage generator 140, the read/write circuit 150, and the data buffer 160. The control logic 170 receives a command CMD and an address ADDR from the outside. The control logic 170 is configured to control the address decoder 120, the common source line controller 130, the voltage generator 140, the read/write circuit 150, and the data buffer 160 in response to the command CMD. The control logic 170 provides the address ADDR to the address decoder 120.

In FIG. 1, it is illustrated that one page buffer is provided for each bit line. However, this is illustrative, and the scope of the present disclosure is not limited thereto. In an embodiment, one page buffer may be provided for every two bit lines, and a switching unit for connecting either one of two bit lines with the page buffer may be provided. For example, a semiconductor device having an even-odd line structure may be provided.

Figure 2:
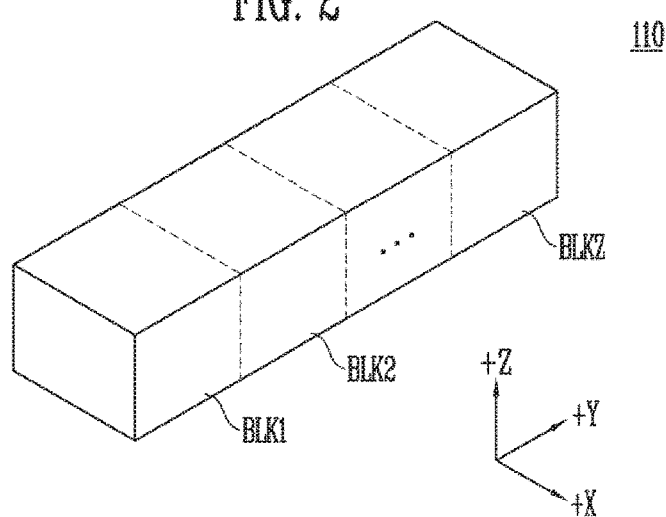
FIG. 2 is a block diagram illustrating an embodiment of a memory cell array of FIG. 1.

FIG. 2 is a block diagram illustrating an embodiment of the memory cell array 110 of FIG. 1.

Referring to FIG. 2, the memory cell array 110 includes a plurality of memory blocks BLK1 to BLKz. Each memory block may have a three-dimensional structure. Each memory block includes a plurality of memory cells stacked above a substrate. The plurality of memory cells are arranged along +X, +Y, and +Z directions. The structure of each memory block will be described in more detail with reference to FIGS. 3 and 4.

Figure 3:
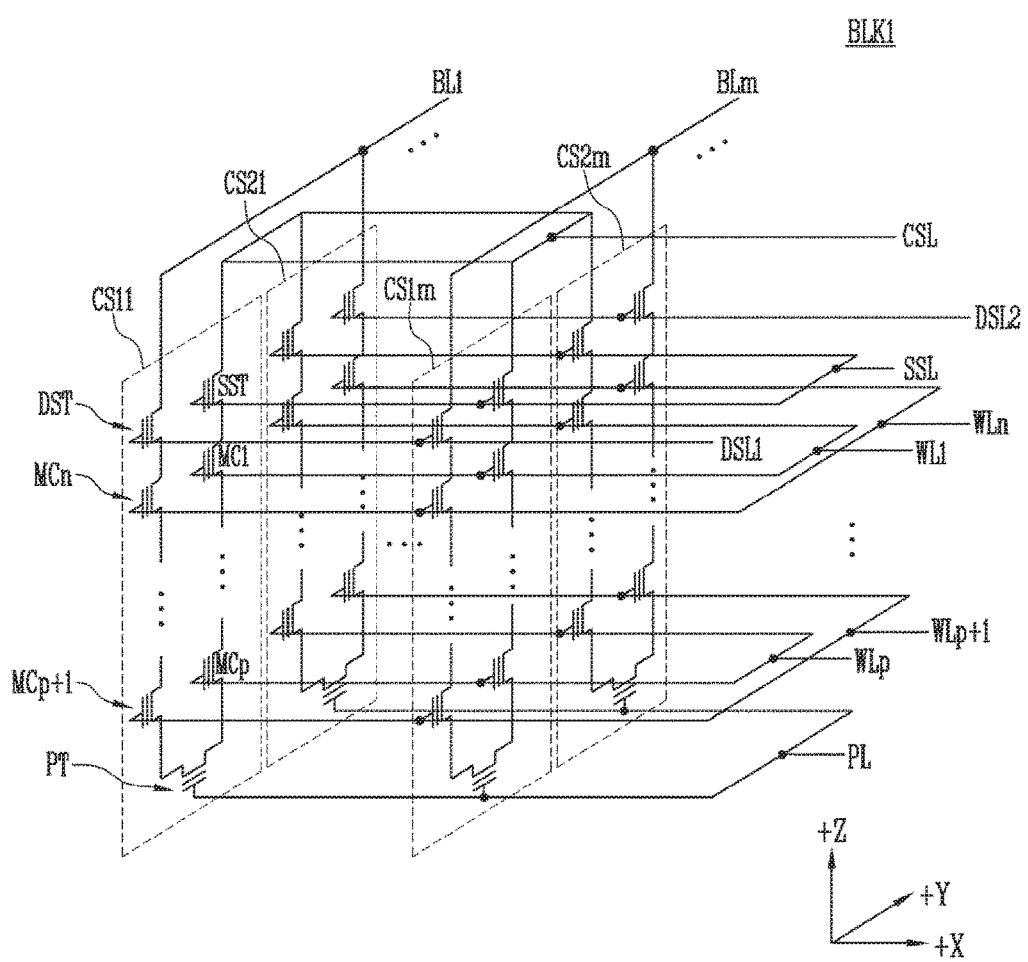
FIG. 3 is a circuit diagram illustrating an embodiment of one of memory blocks of FIG. 2.

FIG. 3 is a circuit diagram illustrating an embodiment of any one BLK1 of the memory blocks BLK1 to BLKz of FIG. 2.

Referring to FIG. 3, a first memory block BLK1 includes a plurality of cell strings CS11 to CS1$m$ and CS21 to CS2$m$. In the first memory block BLK1, m cell strings are arranged in a row direction (i.e., a +X direction). The m cell strings arranged in the row direction are coupled to first to mth bit lines BL1 to BLm, respectively. In addition, q (q is a natural number) cell strings are arranged in a column direction (i.e., a +Y direction). In FIG. 3, only two cell strings arranged in the column direction are illustrated for convenience of description.

Each of the plurality of cell strings CS11 to CS1$m$ and CS21 to CS2$m$ is formed in a 'U' shape. Each of the plurality of cell strings CS11 to CS1$m$ and CS21 to CS2$m$ includes a pipe transistor PT, memory cells MC1 to MCn, a source select transistor SST, and a drain select transistor DST, which are stacked above a substrate (not shown) at a lower portion of the memory block BLK1.

The select transistors SST and DST and the memory cells MC1 to MCn may have structures similar to one another. For example, each of the select transistors SST and DST and the memory cells MC1 to MCn may include a channel layer, a tunneling insulating layer, a charge storage layer, and a blocking insulating layer coupled to a corresponding row line.

The source select transistor SST of each cell string is coupled between a common source line CSL and memory cells MC1 to MCp. The gate of the source select transistor SST is commonly coupled to a source select line SSL.

First to n-th memory cells MC1 to MCn of each cell string are coupled between the source select transistor SST and the drain select transistor DST.

The first to n-th memory cells MC1 to MCn are divided into first to p-th memory cells MC1 to MCp and (p+1)-th to n-th memory cells MCp+1 to MCn. The first to p-th memory cells MC1 to MCp and the (p+1)-th to n-th memory cells MCp+1 to MCn are coupled to each other through the pipe transistor PT. The first to p-th memory cells MC1 to MCp are sequentially arranged in the opposite direction of a +Z direction, and are coupled in series between the source select transistor SST and the pipe transistor PT. The (p+1)-th to n-th memory cells MCp+1 to MCn are sequentially arranged in the +Z direction, and are coupled in series between the pipe transistor PT and the drain select transistor DST. The gates of the first to n-th memory cells MC1 to MCn are coupled to first to n-th word lines WL1 to WLn, respectively.

The gate of the pipe transistor PT of each cell string is coupled to a pipe line PL.

The drain select transistor DST of each cell string is coupled between a corresponding bit line and the memory cells MCp+1 to MCn. The drain select transistors DST of cell strings CS11 to CS1$m$ of a first row are coupled to a first drain select line DSL1. The drain select transistors DST of cell strings CS21 to CS2$m$ of a second row are coupled to a second drain select line DSL2.

Consequently, cell strings (e.g., CS11 to CS1$m$) arranged on the same row (i.e., in the +X direction) are coupled to the same drain select line (e.g., DSL1) through corresponding drain select transistors. Cell strings (e.g., CS11 and CS21) arranged on different rows are coupled to different drain select lines DSL1 and DSL2.

Figure 4:
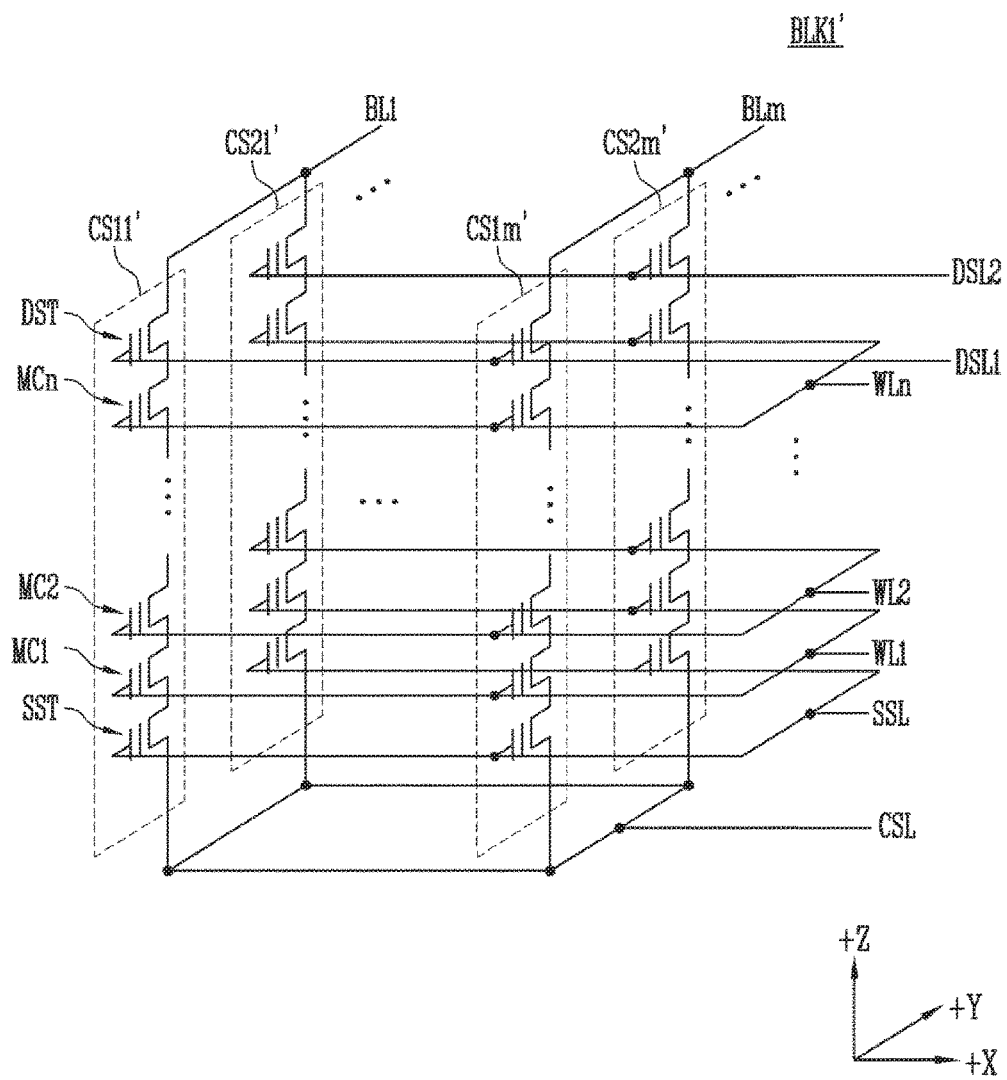
FIG. 4 is a circuit diagram illustrating another embodiment of the one of the memory blocks of FIG. 2.

FIG. 4 is a circuit diagram illustrating another embodiment BLK1' of the one BLK1 of the memory blocks BLK1 to BLKz of FIG. 2.

Referring to FIG. 4, a first memory block BLK1' includes a plurality of cell strings CS11' to CS1$m$' and CS21' to CS2$m$'. In the first memory block BLK1', m cell strings are arranged in a row direction (i.e., a +X direction). The m cell strings arranged in the row direction are coupled to first to m-th bit lines BL1 to BLm, respectively. In addition, q (q is a natural number) cell strings are arranged in a column direction (i.e., a +Y direction). In FIG. 4, only two cell strings arranged in the column direction are illustrated for convenience of description.

Each of the plurality of cell strings CS11' to CS1$m$' and CS21' to CS2$m$' extends along a +Z direction. Each of the plurality of cell strings CS11' to CS1$m$' and CS21' to CS2$m$' includes a source select transistor SST, first to n-th memory cells MC1 to MCn, and a drain select transistor DST, which are stacked above a substrate (not shown) at a lower portion of the memory block BLK1'.

The source select transistor SST of each cell string is commonly coupled to a common source line CSL. The source select transistor SST of each cell string is coupled between the common source line CSL and the memory cells MC1 to MCn. The gate of the source select transistor SST of each cell string is coupled to a source select line SSL.

The first to n-th memory cells MC1 to MCn of each cell string are coupled in series between the source select transistor SST and the drain select transistor DST. Memory cells arranged at the same height are coupled to the same word line. The first to n-th memory cells MC1 to MCn are coupled to first to n-th word lines WL1 to WLn, respectively.

The drain select transistor DST of each cell string is coupled between a corresponding bit line and the memory cells MC1 to MCn. The drain select transistors of cell strings arranged on the same row (i.e., in the +X direction) are coupled to the same drain select line. The drain select transistors DST of cell strings CS11' to CS1m' of a first row are coupled to a first drain select line DSL1. The drain select transistors DST of cell strings CS21' to CS2m' of a second row are coupled to a second drain select line DSL2.

Consequently, the memory block BLK1' of FIG. 4 has an equivalent circuit similar to that of the memory block BLK1 of FIG. 3, except that the pipe select transistor PT is excluded from each cell string.

In FIG. 4, first to m-th cell strings CS11' to CS1m' or CS21' to CS2m' arranged in the row direction are coupled to the first to m-th bit lines BL1 to BLm, respectively. In another embodiment, even bit lines and odd bit lines may be provided instead of the first to m-th bit lines BL1 to BLm. In addition, it will be understood that, among the cell strings CS11' to CS1m' or CS21' to CS2m' arranged in the row direction, even-numbered cell strings may be respectively coupled to the even bit lines and odd-numbered cell strings may be respectively coupled to the odd bit lines.

Figure 5:
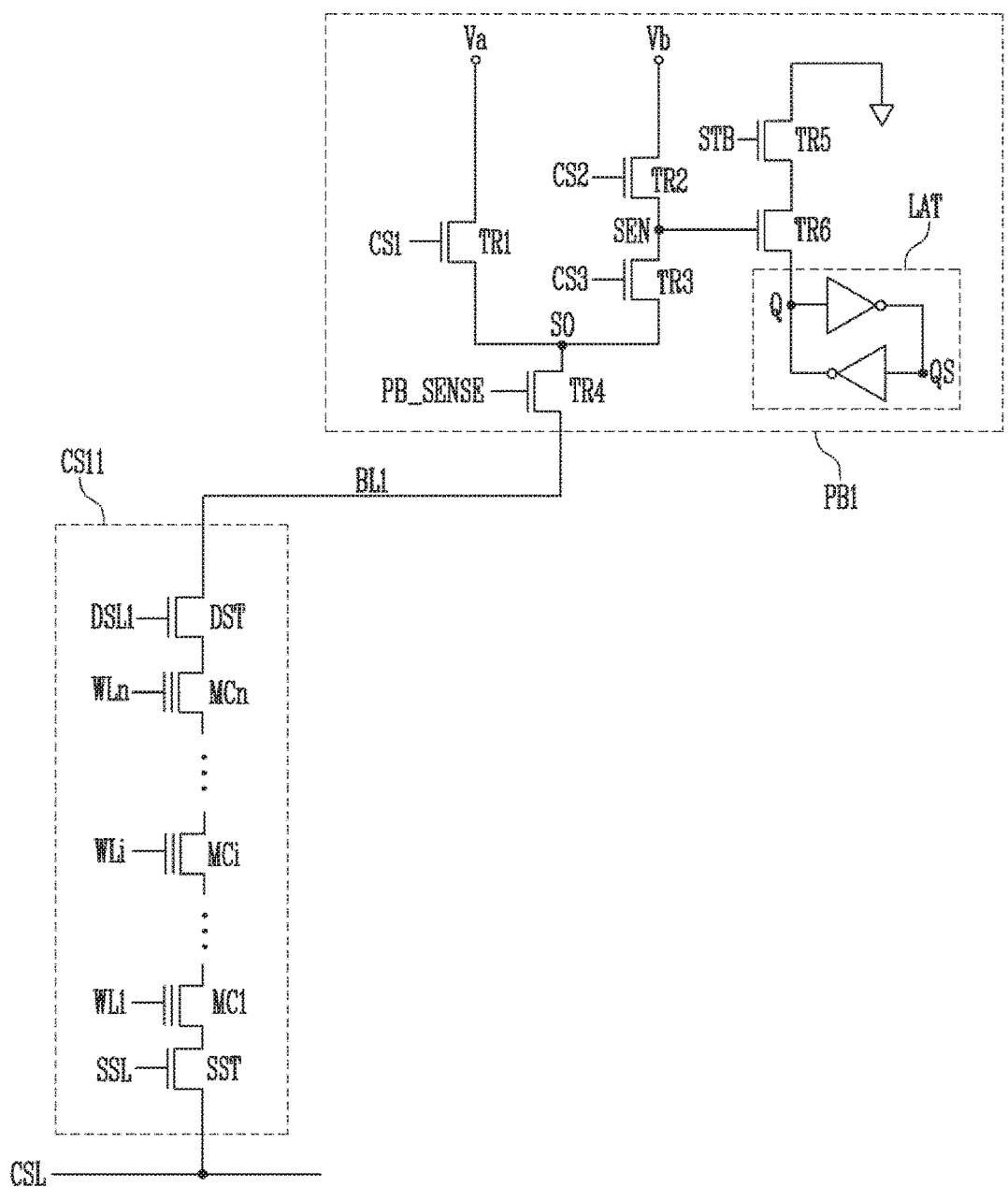
FIG. 5 is a block diagram illustrating any one of page buffers of FIG. 1.

FIG. 5 is a block diagram illustrating any one of the page buffers of FIG. 1.

FIG. 5 is a block diagram illustrating any one PB1 of the page buffers PB1 to PBm of FIG. 1. In FIG. 5, only a selected cell string CS11 between the cell strings CS11 and CS21 coupled to the bit lines BL1 is illustrated for convenience of description. That is, it is assumed that the first drain select line DSL1 is selected and the second drain select line DSL2 is not selected. Meanwhile, in FIG. 5, it is assumed that data of an i-th memory cell MCi is read by the page buffer PB1. That is, in a read operation, a read pass voltage is applied to first to (i−1)-th word lines WL1 to WLi−1 and (i+1)-th to n-th word lines WLi+1 to WLn, and a read voltage is applied to an i-th word line WLi.

Referring to FIG. 5, the page buffer PB1 includes a first current path including a first transistor TR1, a second current path including second and third transistors TR2 and TR3, fourth to sixth transistors TR4 to TR6, and a latch circuit LAT. In an embodiment, the first to sixth transistors TR1 to TR6 may be NMOS transistors.

The first transistor TR1 is turned on as a first control signal CS1 input to the gate terminal of the first transistor TR1 is activated, so that the first current path can be formed between a common node S0 and a first power source Va. In an embodiment, the first power source Va may be a ground power source (0V). Through the first current path, the first power source Va may flow from the common node S0, and the first transistor TR1 emits a current from the common node S0 to the first power source Va. From such a viewpoint, the first transistor may be referred to as an "emission transistor." Further, the second transistor TR2 and the third transistor TR3 are turned on as a second control signal CS2 and a third control signal CS3, which are respectively input to gate terminals of the second transistor TR2 and the third transistor TR3, are activated, so that the second current path can be formed between the common node S0 and a second power source Vb. In an embodiment, the second power source Vb may be a ground power source (0V). Further, when the third transistor TR3 is fully turned on, the potential level of the common node S0 is transmitted to a sensing node SEN. From such a viewpoint, the third transistor TR3 may be referred to as a "transmission transistor." In addition, when the second transistor TR2 is fully turned on, the second power source Vb is transmitted to the second current path. From such a viewpoint, the second transistor TR2 may be referred to as a "power supply transistor."

The fourth transistor TR4 is coupled between the bit line BL and the common node S0. According to an embodiment of the present disclosure, the common source line controller 130 of the semiconductor device 100 may provide a channel voltage to the common source line CSL of the cell string CS11 during a precharge period in the read operation. The channel level of the cell string CS11 is increased, and the potential of the bit line BL1 is increased or maintained according to a program state of the i-th memory cell MCi. When a page buffer sensing signal PB_SENSE is fully activated, the fourth transistor TR4 transmits a voltage of the bit line BL1 to the common node S0. Further, the page buffer PB1 is coupled to the bit line BL1 of the cell string CS11 through the fourth transistor TR4. From such a viewpoint, the fourth transistor TR4 may be referred to as a "bit line sensing transistor."

The voltage of the sensing node SEN is applied to the gate terminal of the sixth transistor TR6. Therefore, the sixth transistor TR6 is turned on or turned off according to the voltage of the sensing node SEN. The voltage of the sensing node SEN is determined according to the program state of the i-th memory cell MCi. Therefore, the sixth transistor TR6 is selectively turned on or turned off according to the program state of the i-th memory cell MCi. From such a viewpoint, the sixth transistor TR6 may be referred to as a "sensing transistor."

The fifth transistor TR5 is coupled between the sixth transistor TR6 and a ground terminal. A strobe signal STB is input to the gate terminal of the fifth transistor TR5. If the strobe signal STB is activated, the fifth transistor TR5 is turned on, and the state of the latch circuit LAT is changed or maintained according to a turn-on or turn-off state of the sixth transistor TR6. The latch circuit LAT includes two inverters to latch data. The latch circuit LAT is coupled to the fifth transistor TR5. The latch circuit LAT stores corresponding data according to whether the fifth and sixth transistors TR5 and TR6 are turned on or turned off. In the embodiment of FIG. 5, a node Q of the latch circuit LAT is initialized to a logic high state, and, accordingly, a node QS of the latch circuit LAT has a logic low state.

If the fifth transistor TR5 is turned on in a state in which the sixth transistor TR6 is turned on, the node Q and the ground terminal are electrically coupled to each other, and, accordingly, the state of the latch circuit LAT is changed. More specifically, the node Q of the latch circuit LAT is changed to the logic low state, and the node QS of the latch circuit LAT is changed to the logic high state.

Although the fifth transistor TR5 is turned on in a state in which the sixth transistor TR6 is turned off, the node Q is not electrically coupled to the ground terminal. Accordingly, the state of the latch circuit LAT is not changed.

That is, whether the state of the latch circuit LAT is changed is determined according to a turn-on or turn-off state of the sixth transistor TR6. Further, the state of the latch circuit LAT is changed or maintained at the time when the fifth transistor TR5 is turned on. From such a viewpoint, the fifth transistor TR5 may be referred to as a "strobe transistor."

In the semiconductor device 100 according to the embodiment of the present disclosure, a bias having a positive value is applied to the common source line CSL such that the bit line BL1 is precharged in a read operation. Accordingly, in the structure of the memory cell structure in which a selected cell string shares a source line with an adjacent cell string, the channel potential of an unselected cell string is increased together, thereby preventing read disturbance. Further, the channel potential of the selected cell string is partially increased, so that the read disturbance can be prevented. In addition, the resistance of a drain terminal is increased, so that a source line bouncing phenomenon can be prevented.

A more detailed operation of the page buffer PB1 shown in FIG. 5 will be described later with reference to FIGS. 6 to 9.

Figure 6:
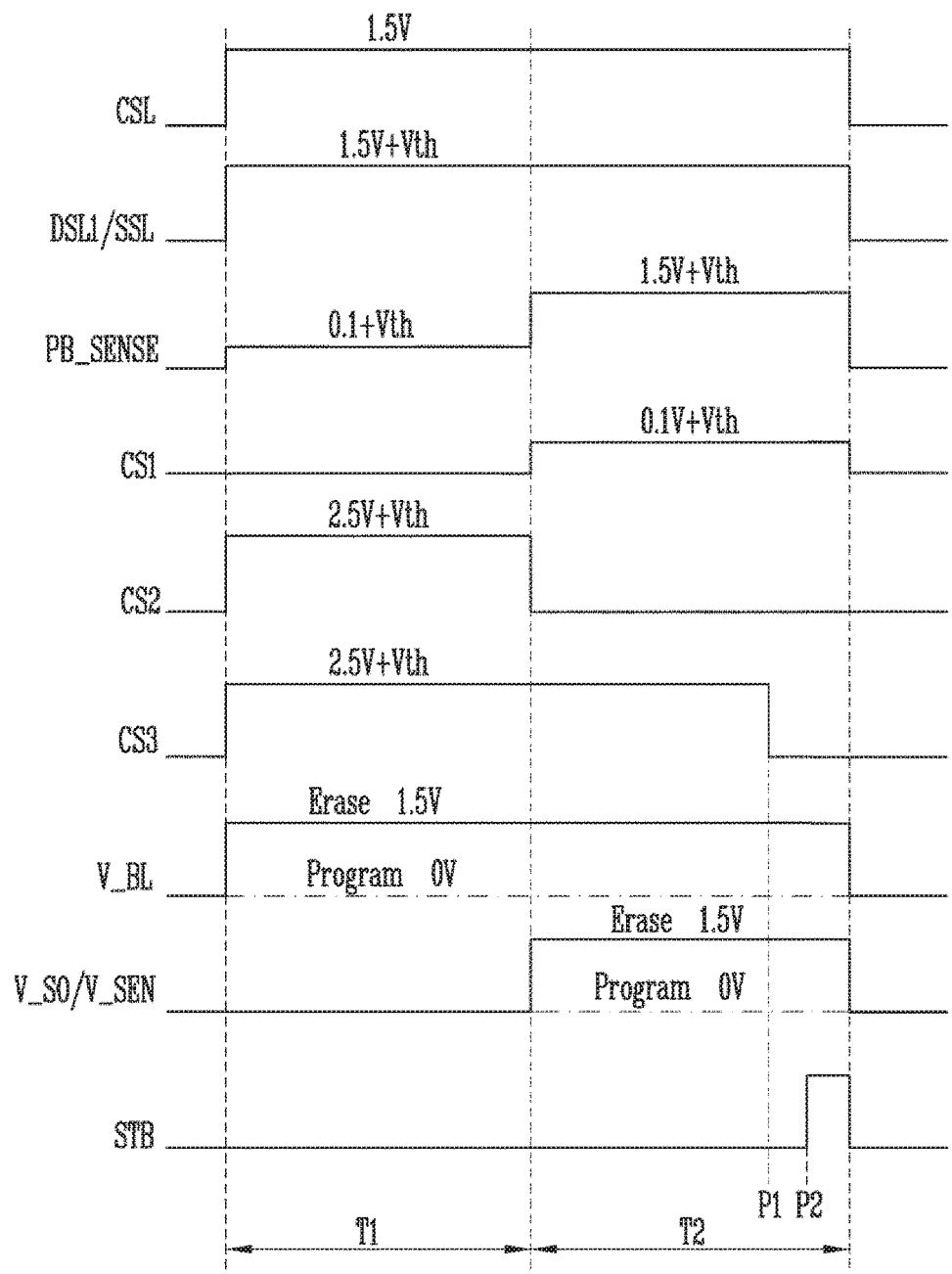
FIG. 6 is a timing diagram illustrating an embodiment of an operation of the page buffer shown in FIG. 5 in a read operation.

FIG. 6 is a timing diagram illustrating an embodiment of an operation of the page buffer shown in FIG. 5 in a read operation.

Referring to FIG. 6, the bit line BL1 is precharged during a first period T1. To this end, a channel current of the common source line CSL is transmitted to the bit line BL1 according to a threshold voltage of a selected memory cell.

During the first period T1, a positive bias is applied to the common source line CSL. For example, a bias of 1.5V may be transmitted to the common source line CSL. Accordingly, the channel current can be provided to the cell string CS11.

A source select voltage is applied to the source select line SSL, and a drain select voltage is applied to the drain select line DSL1. Accordingly, the source select transistor SST and the drain select transistor DST are turned on. For example, each of the source select voltage and the drain select voltage may be 1.5V+Vth (Vth is a threshold voltage of a corresponding transistor). Accordingly, the drain select transistor DST coupled to the selected drain select line DSL1 can transmit the channel current to the bit line BL1.

Meanwhile, the page buffer sensing voltage PB_SENSE is increased. The page buffer sensing voltage PB_SENSE is set to allow the fourth transistor TR4 to be slightly turned on. The fact that the fourth transistor TR4 is "slightly" turned on means that an effective voltage applied to the gate terminal of the fourth transistor TR4 is in a range lower than a certain reference voltage. The effective voltage has a value obtained by subtracting a threshold voltage of a transistor from a gate voltage. If the effective voltage increases, a channel depth increases, and, therefore, a channel resistance decreases. Thus, when the effective voltage is in the range lower than the reference voltage, the channel resistance is maintained as a large value, so that no current flows in spite of a source-drain voltage of the transistor (when the gate voltage is equal to the threshold voltage) or only a small amount of current flows. The reference voltage may be determined as various values according to characteristics of the transistor. In an exemplary embodiment, the reference voltage with respect to the fourth transistor TR4 may be 0.3V. In this case, the page buffer sensing voltage PB_SENSE may be set to a voltage that is larger than "Vth" and is smaller than "0.3V+Vth." For example, the page buffer sensing voltage PB_SENSE may be set to a value of 0.1V+Vth. Accordingly, during a precharge period, no current flows through the fourth transistor TR4, or only a small amount of current flows through the fourth transistor TR4.

The first control signal CS1 is not increased during the first period T1, and, accordingly, the first transistor TR1 maintains the turn-off state. Thus, no current flows in the first current path formed between the common node S0 and the first power source Va during the precharge period.

The second and third control signals CS2 and CS3 are increased. The second and third control signals CS2 and CS3 are set to allow the second and third transistors TR2 and TR3 to be fully turned on. The fact that the second and third transistors TR2 and TR3 are "fully" turned on means that an effective voltage applied to the gate terminals of the second and third transistors TR2 and TR3 is in a range higher than a certain reference voltage. That is, since the effective voltage is in the range higher than the reference voltage, a channel resistance is maintained as a low value, so that a current fully flows when a source-drain voltage of a transistor is applied. For example, each of the second third control signals CS2 and CS3 has 2.5V+Vth.

In this specification, a state in which a transistor is "fully" turned on is referred to as a "first turn-on state," and a state in which the transistor is "slightly" turned on as compared with the state in which the transistor is "fully" turned on is referred to as a "second turn-on state." As described above, when the transistor is turned on in the first turn-on state, a current fully flows. When the transistor is turned on in the second turn-on state, no current flows or only a small amount of current flows.

It is assumed first that a selected memory cell MCi has an erase state. That is, a threshold voltage of the selected memory cell MCi is lower than a read voltage applied to a selected word line WLi. In this case, as the selected memory cell MCi is turned on, the channel current of the common source line CSL may be transmitted to the bit line BL1 through the cell string CS11. At this time, the bit line BL1 has a specific voltage. For example, a voltage V_BL of the bit line BL1 is 1.5V.

During the first period T1, the first transistor TR1 is in the turn-off state, and the second and third transistors TR2 and TR3 are in the turn-on state, while the fourth transistor TR4 is slightly turned on in the second turn-on state. Thus, a small amount of current flows through the bit line BL1, the fourth transistor TR4, the third transistor TR3, the second transistor TR2, and the second power source Vb. As the second transistor TR2 and the third transistor TR3 are turned on, a voltage V_SEN of the sensing node SEN and a voltage V_S0 of the common node S0 maintain a state of 0V. In addition, a voltage difference between the voltage (e.g., 1.5V) of the bit line BL1 and the second power source Vb (i.e., 0V) is mostly blocked by the fourth transistor TR4. Through the above-described process, when the selected memory cell MCi is in the erase state, the bit line BL1 is precharged to a voltage value of 1.5V.

It is assumed this time that the selected memory cell MCi has a program state. The threshold voltage of the selected memory cell MCi is higher than the read voltage applied to the selected word line WLi. The selected memory cell MCi is turned off, and the channel current provided to the common source line CSL may be blocked by the selected memory cell MCi. That is, the channel current of the common source line CSL is not transmitted to the bit line BL1, and the voltage V_BL of the bit line BL1 may maintain a low voltage value (e.g., 0V).

During a second period T2 of FIG. 6, the voltage of the common source line CSL is maintained as 1.5V, and the voltage of each of the drain select line DSL1 and the source select line VSS is maintained as 1.5V+Vth.

The buffer sensing signal PB_SENSE applied to the fourth transistor TR4 is increased from 0.1V+Vth to 1.5V+Vth. Accordingly, the fourth transistor TR4 is fully turned on in the first turn-on state, and the voltage value V_S0 of the common node S0 is determined according to a voltage value of the bit line BL1. As described above, when the selected memory cell MCi has the erase state, the voltage V_BL of the bit line BL1 is 1.5V in the first period T1. In this case, as the fourth transistor TR4 is fully turned on, the voltage value V_S0 of the common node S0 also becomes 1.5V.

When the selected memory cell MCi has the program state, the voltage V_BL of the bit line BL1 is 0V in the first period T1. In this case, although the fourth transistor TR4 is turned on, the voltage value V_S0 of the common node S0 may maintain 0V. Meanwhile, as the third transistor TR3 is turned on and the second transistor TR2 is turned off as will be described later, the voltage value V_S0 of the common node S0 is transmitted to the sensing node SEN.

The voltage value of the first control signal CS1 applied to the first transistor TR1 is increased to 0.1V+Vth. Accordingly, the first transistor TR1 that has been turned off during the first period T1 is slightly turned on in the second turn-on state, and no current flows through the first transistor TR1 or only a small amount of current flows through the first transistor TR1.

Meanwhile, the voltage value of the second control signal CS2 applied to the second transistor TR2 is decreased to 0V. Accordingly, the second transistor TR2 is turned off, and electrical coupling between the sensing node SEN and the second power source Vb is interrupted.

The third control signal CS3 applied to the third transistor TR3 is decreased at a point P1 of time in the second period T2. Thus, the third transistor TR3 is turned off at the point P1 in time. Meanwhile, since the fourth transistor TR4 is turned off, the voltage V_BL of the bit line BL1 is transmitted to the common node S0. In addition, since the voltage V_BL of the bit line BL1 is transmitted to the common node S0 before the point P1 in time when the third transistor TR3 is turned off, the voltage V_S0 of the common node S0 is transmitted to the sensing node SEN before the point P1 in time. Consequently, the voltage V_BL of the bit line BL1 is transmitted to the sensing node SEN via the common node S0. The third transistor TR3 is turned off after the voltage V_BL of the bit line BL1 is transmitted to the sensing node SEN via the common node S0. In FIG. 6, it is illustrated that the third control signal CS3 is decreased at the point P1 in time. However, this is illustrative, and the third control signal CS3 may be decreased after the point P1. For example, the third control signal CS3 may be decreased at a point P2 in time or be decreased when the second period T2 is terminated. If the third control signal CS3 is decreased, the third transistor TR3 is turned off, and, therefore, the sensing node SEN may be floated.

The sixth transistor TR6 is turned on or turned off according to the voltage value of the sensing node SEN. For example, when the selected memory cell MCi is in the erase state, the voltage V_SEN of the sensing node SEN maintains 1.5V during the second period T2 as shown in FIG. 6, and thus the sixth transistor TR6 is turned on. When the selected memory cell MCi is in the program state, the voltage V_SEN maintains 0V during the second period T2 as shown in FIG. 6, and thus the sixth transistor TR6 is turned off.

After the voltage V_BL of the bit line BL1 is transmitted to the sensing node SEN via the common node S0, the strobe signal STB is activated at the point P2 of time, and thus the fifth transistor TR5 is turned on. If the sixth transistor TR6 is in the turn-on state, the node Q of the latch circuit LAT is electrically coupled to the ground power source. As described above, since the node Q of the latch circuit LAT is initialized to the logic high state, a data value of the latch circuit LAT is changed in the above-described case. If the sixth transistor TR6 is in the turn-off state, the node Q of the latch circuit LAT is not coupled to the ground power source. In this case, the data value of the latch circuit LAT is not changed.

Since the sixth transistor TR6 is turned on when the selected memory cell MCi is in the erase state, the data value of the latch circuit LAT is changed when the selected memory cell MCi is in the erase state. On the other hand, since the sixth transistor TR6 is turned off when the selected memory cell MCi is in the program state, the data value of the latch circuit LAT is not changed when the selected memory cell MCi is in the program state.

As described above, in the semiconductor device 100 according to the present disclosure, the bit line BL1 is precharged by supplying a current to a channel region, so that data stored in the selected memory cell MCi can be transmitted to the latch circuit LAT.

Figure 7:
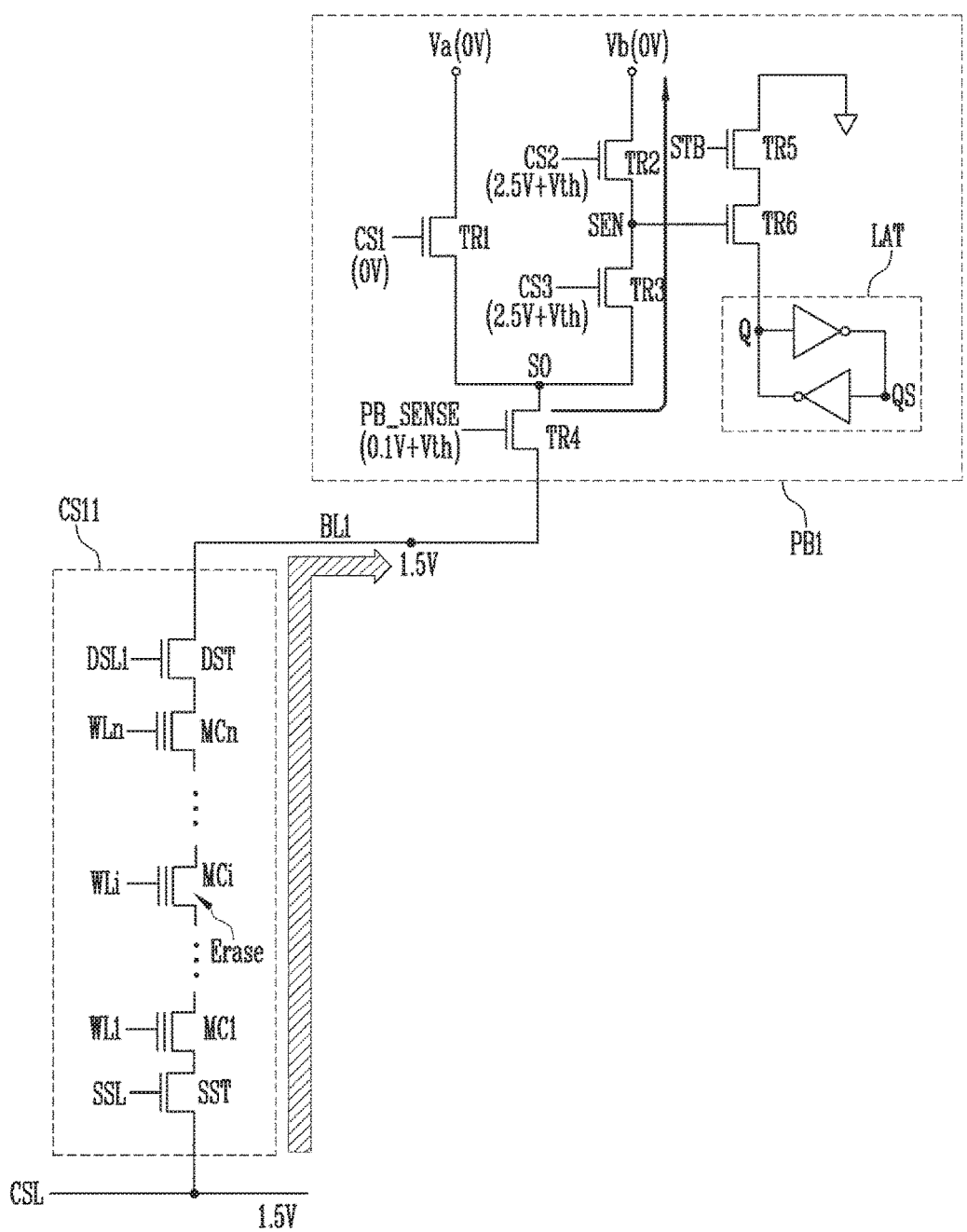
FIG. 7 is a diagram illustrating a precharge operation of the page buffer according to the embodiment of FIG. 6 when a selected memory cell is in an erase state.

FIG. 7 is a diagram illustrating a precharge operation of the page buffer according to the embodiment of FIG. 6 when the selected memory cell is in the erase state. Referring to FIGS. 6 and 7 both, an operation during the first period T1 is illustrated in FIG. 7.

Since the selected memory cell MCi of the cell string CS11 is in the erase state, the bit line BL1 has a voltage of 1.5V when the voltage of 1.5V is applied to the common source line CSL. The fourth transistor TR4 is in the state in which it is slightly turned on, i.e., the second turn-on state. Thus, a current slightly flows through the fourth transistor TR4 or no current flows through the fourth transistor TR4. Since the first transistor TR1 is turned off, the current flowing through the fourth transistor TR4 flows toward the third transistor TR3, the second transistor TR2, and the second power source Vb. Since the second and third transistors TR2 and TR3 are fully turned on, the voltage value of each of the common node S0 and the sensing node SEN maintains the voltage value of the second power source Vb, i.e., 0V.

That is, when the selected memory cell MCi is in the erase state, the bit line BL1 is precharged to a voltage value of 1.5V, and the voltage value of each of the common node S0 and the sensing node SEN maintains 0V.

Figure 8:
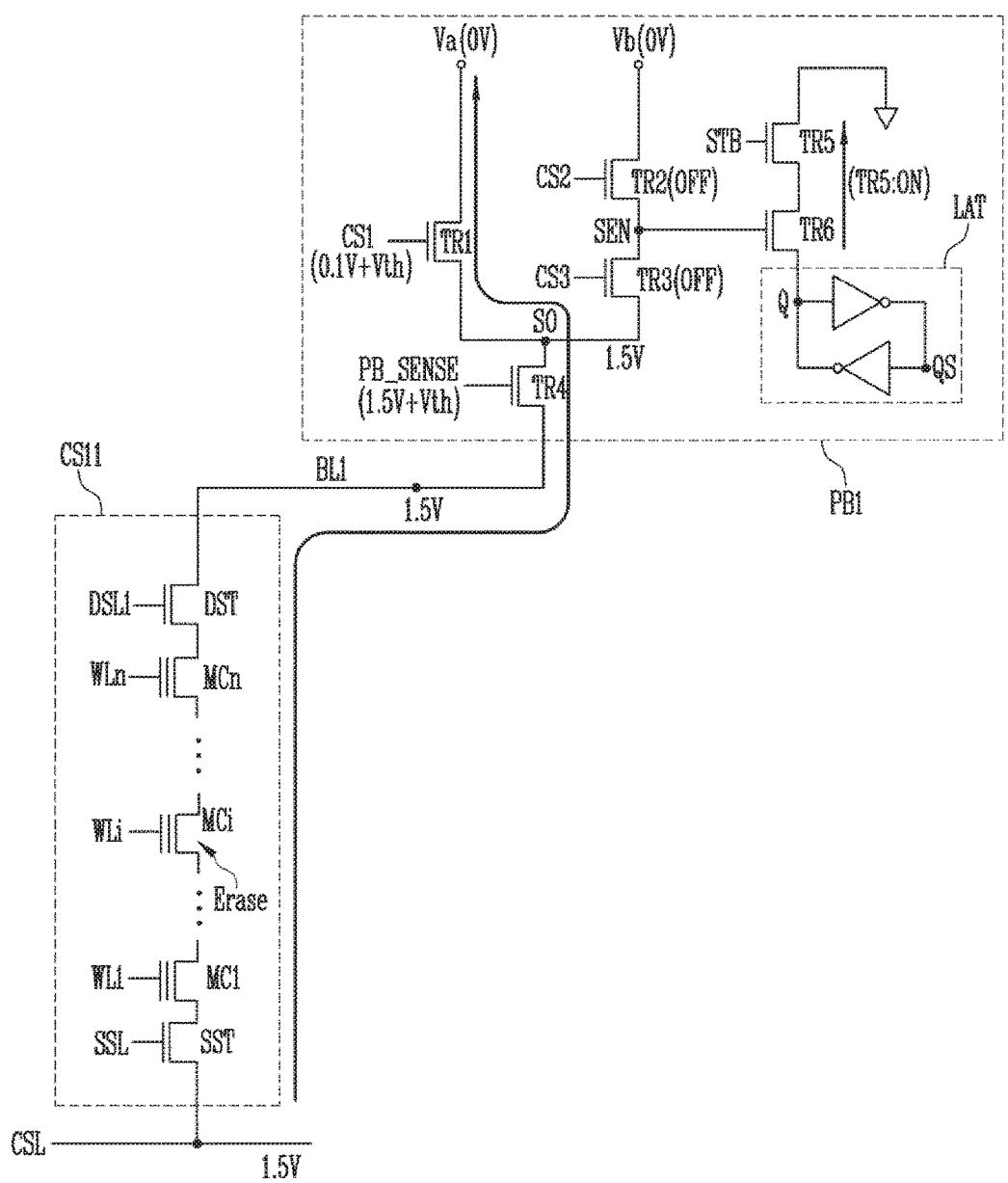
FIG. 8 is a diagram illustrating a sensing operation of the page buffer according to the embodiment of FIG. 6 when the selected memory cell is in the erase state.

FIG. 8 is a diagram illustrating a sensing operation of the page buffer according to the embodiment of FIG. 6 when the selected memory cell is in the erase state.

After the precharge operation of FIG. 7, the voltage value of the page sensing signal PB_SENSE is increased to 1.5V+Vth in the second period T2. Accordingly, the fourth transistor TR4 is fully turned on, and the voltage of the bit line BL1 is transmitted to the common node S0. As the second period T2 is started, the second transistor TR2 is turned off, and the electrical coupling between the sensing node SEN and the second power source Vb is interrupted. Meanwhile, the third transistor TR3 maintains the turn-on state during a certain time after the second period T2 is started, and then turned off at the point P1 in time. Thus, the voltage of the common node S0 is transmitted to the sensing node SEN while the third transistor TR3 is maintaining the turn-on state before the point P1. If the third transistor TR3 is turned off at the point P1, the sensing node SEN is floated to maintain a current voltage. That is, when the selected memory cell MCi is in the erase state, 1.5V is transmitted to the sensing node SEN, and maintains the corresponding voltage value even after the point P1.

The third transistor TR3 is turned off after the point P1. The first transistor TR1 is slightly turned on in the second turn-on state. Thus, as shown in FIG. 8, a current slightly flows toward the first power source Va through the first transistor TR1 from the common node S0, or no current flows. Meanwhile, the fifth transistor TR5 is turned on at the point P2 in time. Since the sixth transistor TR6 is in the turn-on state, a current path is formed between the node Q of the latch circuit LAT and the ground. Accordingly, the voltage value of the node Q, which was initially in the logic high state, is decreased to be changed to the logic low state. Consequently, data stored in the latch circuit LAT is changed. In summary, with reference to FIGS. 7 and 8, when the selected memory cell MCi is in the erase state, the voltage of the bit line BL1 is increased during the first period T1. Accordingly, as the sixth transistor TR6 is turned on in the second period T2, the data stored in the latch circuit LAT is changed by the strobe signal STB.

Figure 9:
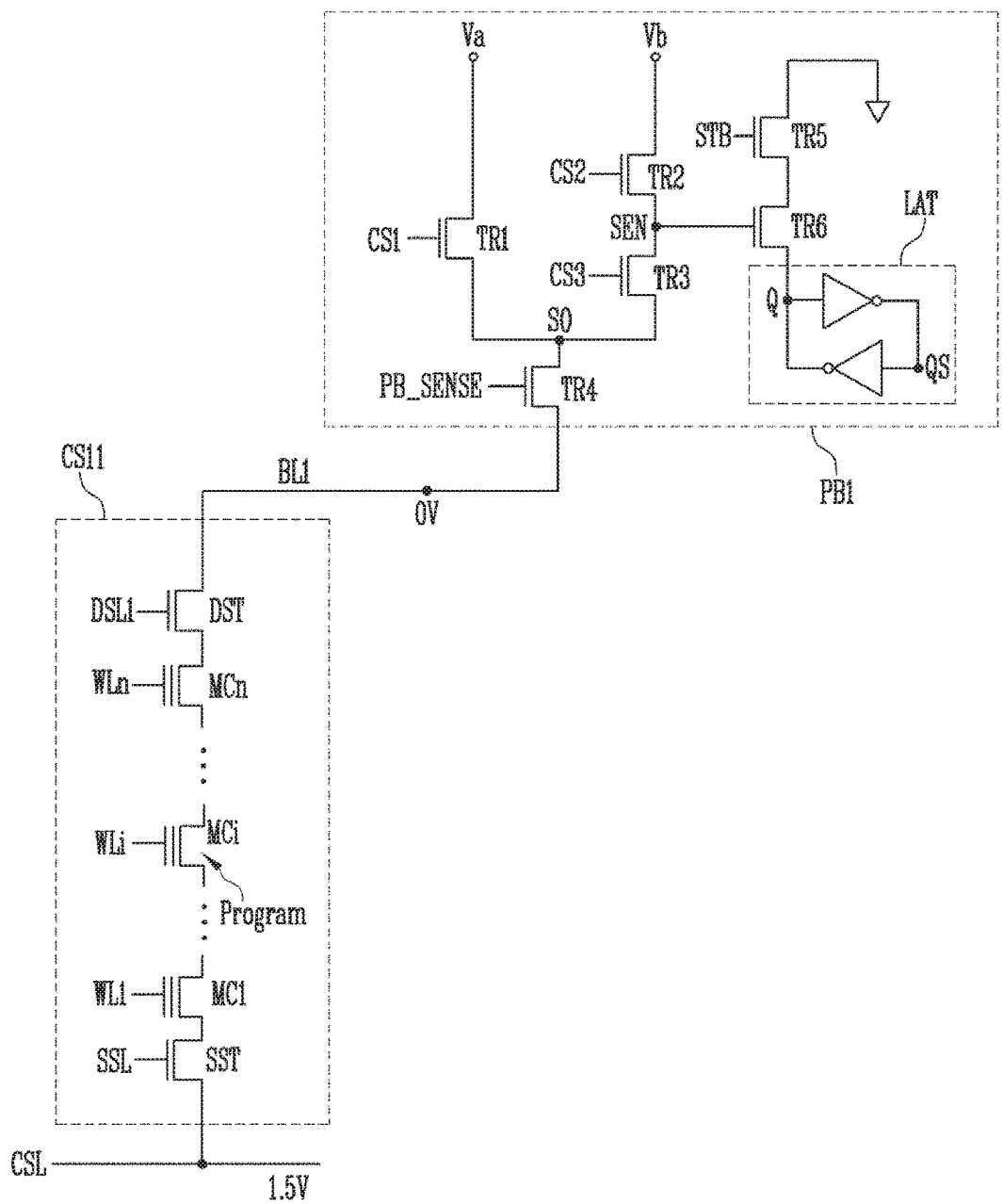
FIG. 9 is a diagram illustrating an operation of the page buffer according to the embodiment of FIG. 6 when the selected memory cell is in a program state.

FIG. 9 is a diagram illustrating an operation of the page buffer according to the embodiment of FIG. 6 when the selected memory cell is in the program state.

As described above, when the selected memory cell MCi is in the program state, no current flows toward the bit line BL1 even when a positive voltage (1.5V) is applied to the common source line CSL. Accordingly, the voltage of the bit line BL1 is not increased but maintains a voltage value of 0V. After that, the sixth transistor TR6 is not turned on in the second period T2, and, accordingly, the data stored in the latch circuit LAT is not changed even when the strobe signal STB is activated.

Figure 10:
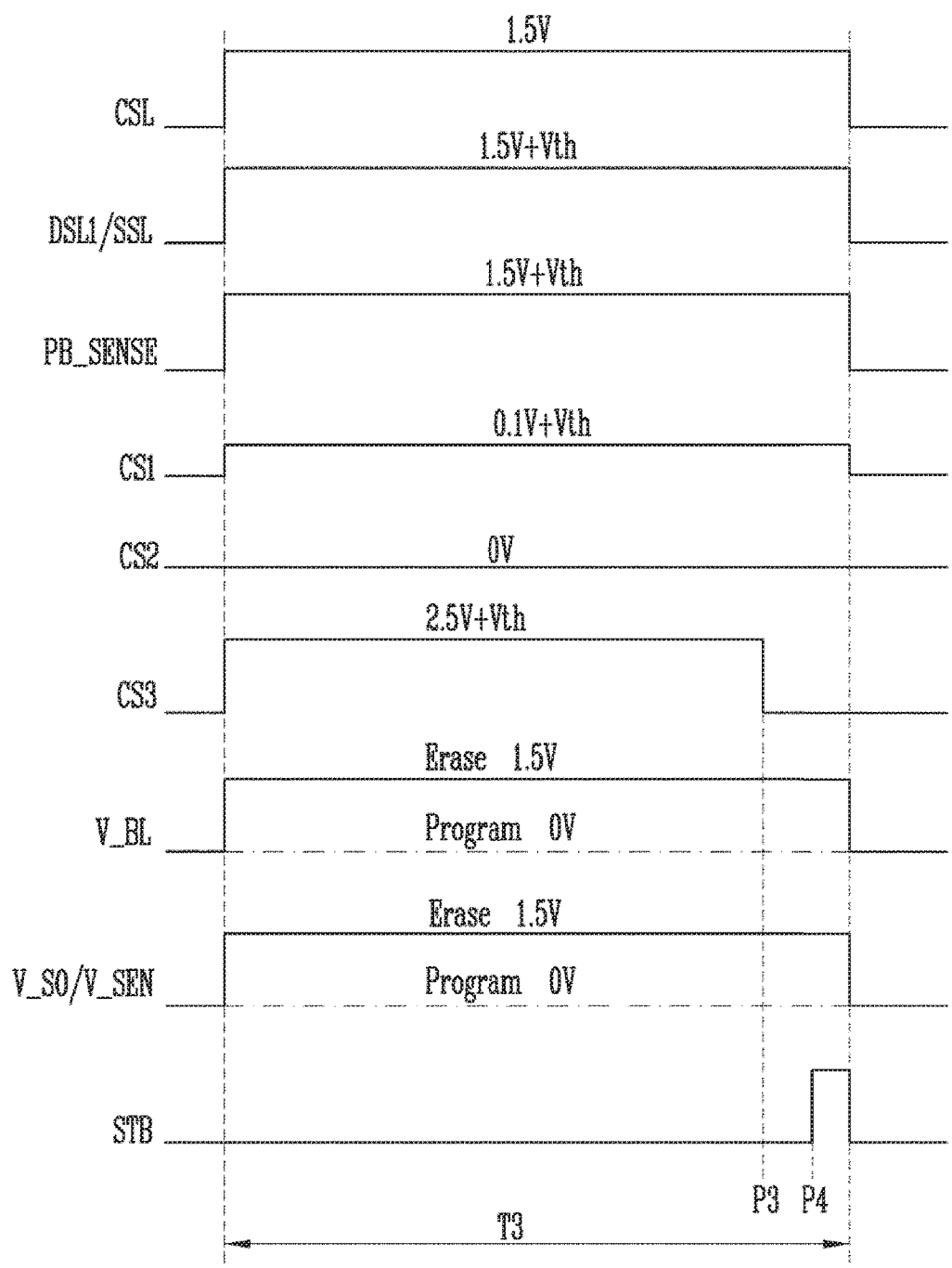
FIG. 10 is a timing diagram illustrating another embodiment of the operation of the page buffer shown in FIG. 5 in the read operation.
Figure 11:
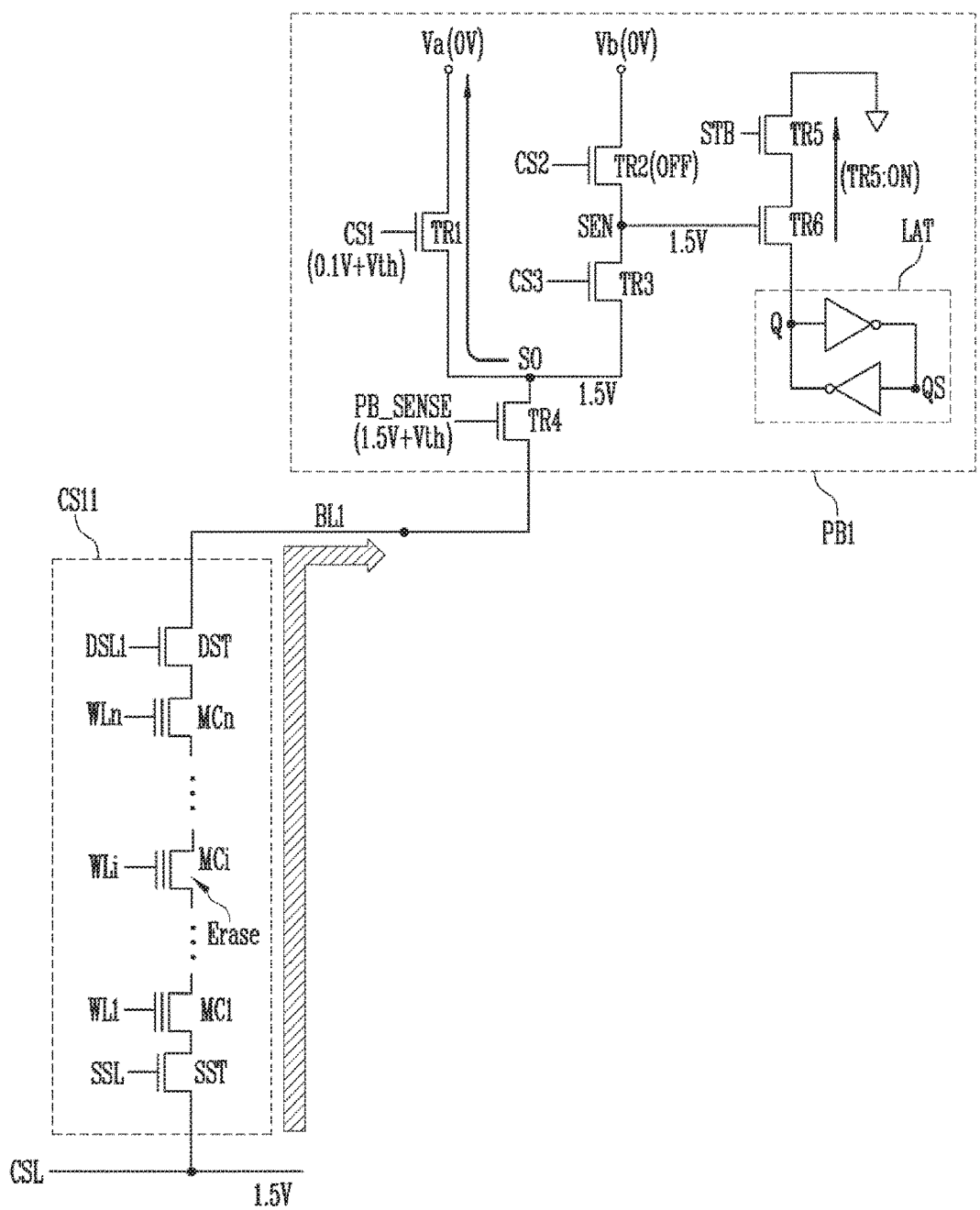
FIG. 11 is a diagram illustrating a read operation of the page buffer according to the embodiment of FIG. 10 when the selected memory cell is in the erase state.

FIG. 10 is a timing diagram illustrating another embodiment of the operation of the page buffer shown in FIG. 5 in the read operation. FIG. 11 is a diagram illustrating a read operation of the page buffer according to the embodiment of FIG. 10 when the selected memory cell is in the erase state. Hereinafter, the operations will be described with reference to FIGS. 10 and 11.

Referring to FIG. 10, unlike FIG. 6, a period is not divided. During a period T3, a positive voltage value is provided to the common source line CSL, and a voltage of 1.5V+Vth is supplied to the drain select line DSL1 and the source select line SSL, while the page buffer sensing signal PB_SENSE is also maintained as the voltage value of 1.5V+Vth. Thus, the drain select transistor DST, the source select transistor SST, and the fourth transistor TR4 are fully turned on. Accordingly, when the selected memory cell MCi is in the erase state, the bit line BL1 is precharged to 1.5V as shown in FIG. 11, and the voltage V_BL of the bit line BL1 is transmitted to the common node S0.

The first control signal CS1 has a voltage value of 0.1V+Vth during the period T3. Accordingly, the first transistor TR1 is slightly turned on in the second turn-on state. Meanwhile, since the second control signal CS2 maintains a voltage value of 0V, the second transistor TR2 is turned on, and the electrical coupling between the sensing node SEN and the second power source Vb is interrupted.

The third control signal CS3 maintains a voltage value of 2.5V+Vth until before a point P3 in time in the period T3. Thus, the third transistor TR3 is fully turned on to transmit the voltage value V_S0 of the common node S0 to the sensing node SEN. When the selected memory cell MCi is in the erase state as shown in FIG. 11, a voltage value of 1.5V is transmitted to the sensing node SEN, and, accordingly, the sixth transistor TR6 maintains the turn-on state. In this state, although the third transistor TR3 is turned off at the point P3 in time, the sensing node SEN is floated to maintain the voltage value of 1.5V. Accordingly, the sixth transistor TR6 also maintains the turn-on state.

As the strobe signal STB is activated at a point P4 in time, the fifth transistor TR5 is turned on. When the selected memory cell MCi is in the erase state as shown in FIG. 11, the sixth transistor TR6 is in the turn-on state, and thus a current path is formed between the node Q of the latch circuit LAT and the ground. Accordingly, the voltage value of the node Q, which was initially in the logic high state, is decreased to be changed to the logic low state. Consequently, data stored in the latch circuit LAT is changed.

If the selected memory cell MCi is in the program state, the sixth transistor TR6 may be in the turn-off state at the point P4 of time. Therefore, in this case, no current path is formed between the node Q of the latch circuit LAT and the ground. Accordingly, the voltage value of the node Q, which was initially in the logic high state, is maintained, and the data stored in the latch circuit LAT is not changed.

As described above, in the semiconductor device 100 according to the embodiment of the present disclosure, a bias having a positive value is applied to the common source line CSL such that the bit line BL1 is precharged in a read operation. Accordingly, in the structure of the memory cell structure in which a selected cell string shares a source line with an adjacent cell string, the channel potential of an unselected cell string is increased together, thereby preventing read disturbance. Further, the channel potential of the selected cell string is partially increased, so that the read disturbance can be prevented. In addition, the resistance of a drain terminal is increased, so that a source line bouncing phenomenon can be prevented.

Figure 12:
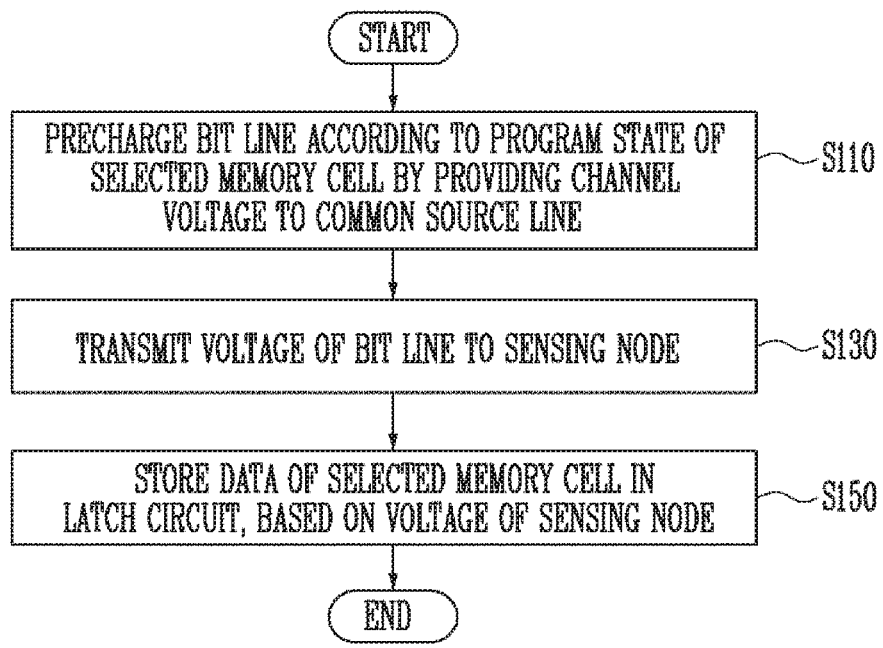
FIG. 12 is a flowchart illustrating an operating method of the semiconductor device according to an embodiment of the present disclosure.

FIG. 12 is a flowchart illustrating an operating method of the semiconductor device according to an embodiment of the present disclosure.

Referring to FIG. 12, the operating method of the semiconductor device according to the embodiment of the present disclosure includes step S110 of precharging a bit line according to a program state of a selected memory cell of a cell string by providing a channel voltage to a common source line, step S130 of transmitting a voltage of the precharged bit line to a sensing node coupled to a gate electrode of a sensing transistor, and step S150 of storing data of the selected memory cell in a latch circuit, based on the voltage transmitted to the sensing node. A detailed description of each step will be described later with reference to FIGS. 13 to 15.

Figure 13:
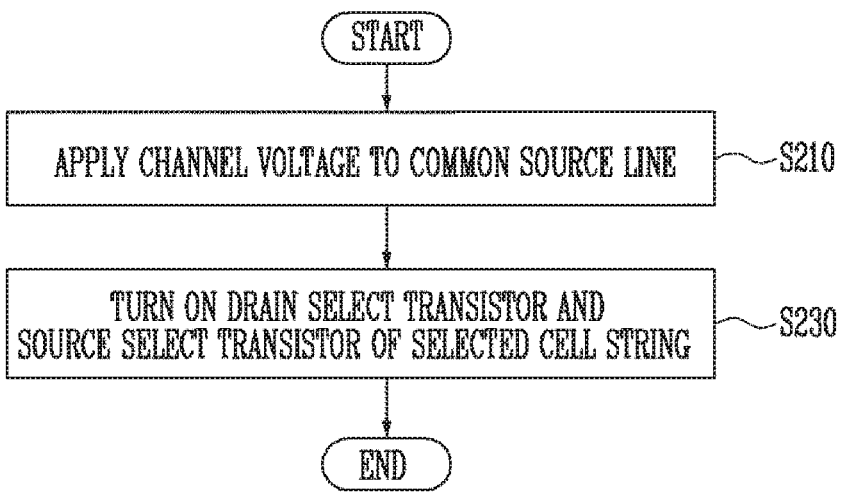
FIG. 13 is a flowchart illustrating an embodiment of a step of precharging a bit line, which is shown in FIG. 12.

FIG. 13 is a flowchart illustrating an embodiment of the step of precharging the bit line, which is shown in FIG. 12.

Referring to FIG. 13, the step S110 of FIG. 12 includes step S210 of applying a channel voltage having a positive voltage value (e.g., 1.5V) to the common source line CSL coupled to the cell string CS11 and step S230 of turning on the drain select transistor DST and the source select transistor SST of the cell string CS11.

As shown in FIG. 6, a channel voltage having a voltage value of 1.5V is applied to the common source line CSL in the period T1 (S210). In addition, signals having a voltage value of 1.5+Vth are applied to the drain select line DSL1 and the source select line SSL in the period T1 (S210).

Alternatively, as shown in FIG. 10, a channel voltage having a voltage value of 1.5V is applied to the common source line CSL in the period T3 (S210). In addition, signals having a voltage value of 1.5+Vth are applied to the drain select line DSL1 and the source select line SSL in the period T3 (S210).

As shown in FIG. 7 or 11, the bit line BL1 is precharged through the steps S210 and S230 (S110).

Figure 14:
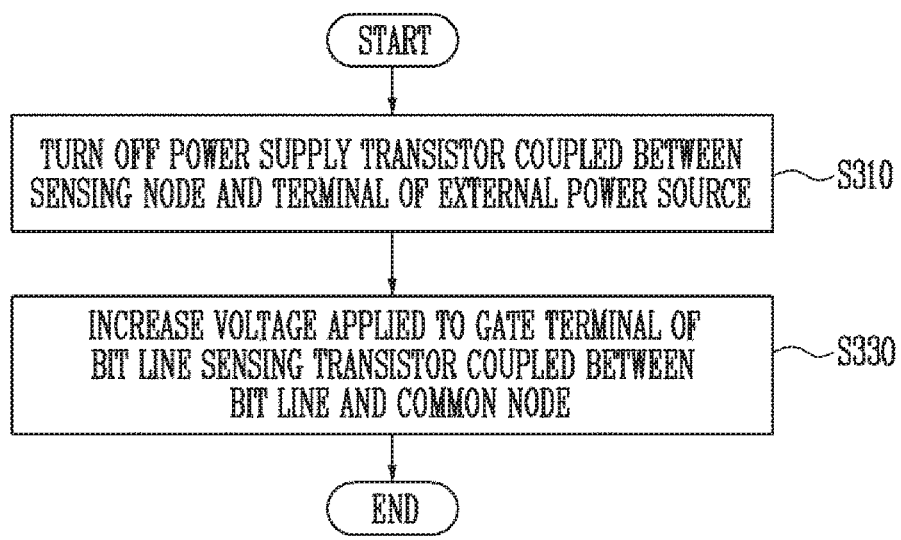
FIG. 14 is a flowchart illustrating an embodiment of a step of transmitting a voltage of the bit line to a sensing node, which is shown in FIG. 12.

FIG. 14 is a flowchart illustrating an embodiment of the step of transmitting the voltage of the bit line to the sensing node, which is shown in FIG. 12.

Referring to FIG. 14, the step S130 of FIG. 12 includes step S310 of turning off the power supply transistor, e.g., the second transistor TR2 coupled between the sensing node SEN and a terminal of an external power source (e.g., the second power source Vb) and step S330 of increasing a voltage value (e.g., a voltage value of the page buffer sensing signal PB_SENSE) applied to the gate terminal of the bit line sensing transistor, e.g., the fourth transistor TR4 coupled between the bit line BL1 and the common node S0.

As shown in FIG. 6, the voltage value of the second control signal CS2 is decreased in the period T2, so that the second transistor TR2 is turned off (S310). Accordingly, the electrical coupling between the second power source Vb and the sensing node SEN is interrupted. In addition, the voltage value of the page buffer sensing signal PB_SENSE is increased from 0.1V+Vth to 1.5V+Vth in the period T2 (S330). Accordingly, the fourth transistor TR4 is turned on, so that the voltage V_BL of the bit line BL1 is transmitted to the common node S0.

Figure 15:
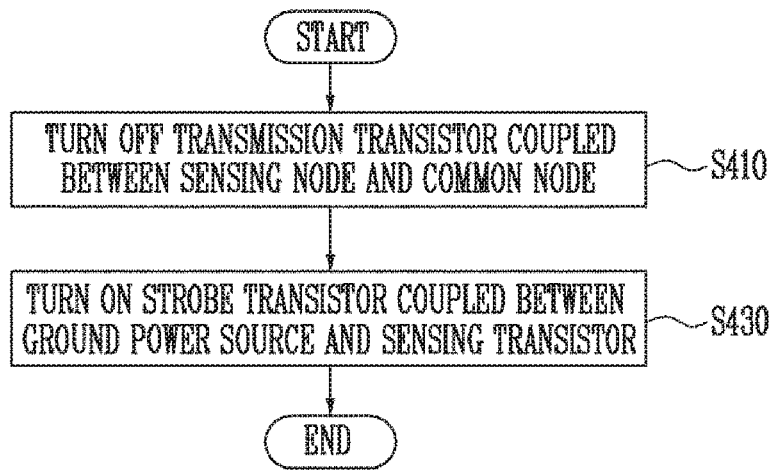
FIG. 15 is a flowchart illustrating an embodiment of a step of storing data of a selected memory cell in a latch circuit, which is shown in FIG. 12.

FIG. 15 is a flowchart illustrating an embodiment of the step of storing the data of the selected memory cell in the latch circuit, which is shown in FIG. 12.

Referring to FIG. 15, the step S150 of FIG. 12 includes step S410 of turning off the transmission transistor, i.e., the third transistor TR3 coupled between the sensing node SEN and the common node S0 and step S430 of turning on the strobe transistor, i.e., the fifth transistor TR5 coupled between the sensing transistor having the gate electrode coupled to the sensing node SEN, i.e. a first electrode of the sixth transistor T6 and the ground terminal.

As shown in FIG. 6, the voltage of the third control signal CS3 is decreased at the point P1 in time in the period T2. Accordingly, the third transistor TR3 is turned off (S410), and the sensing node SEN is floated. In addition, as the strobe signal STB is activated at the point P2 in time in the period T2, the fifth transistor TR5 is turned on (S430), and the data stored in the latch circuit LAT is changed or maintained according to the program state of the selected memory cell MCi.

Figure 16:
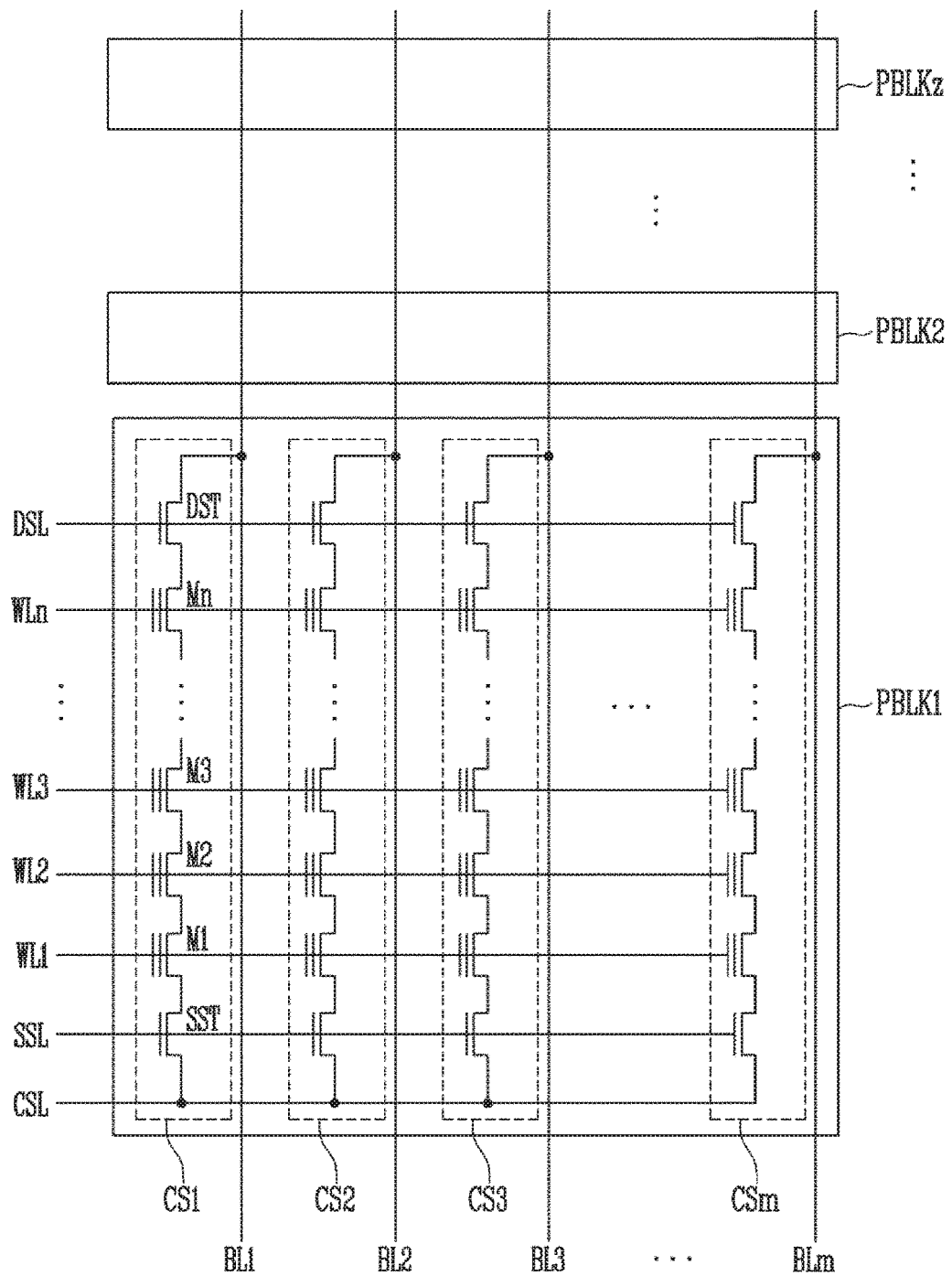
FIG. 16 is a block diagram illustrating another embodiment of the memory cell array of FIG. 1.

FIG. 16 is a block diagram illustrating another embodiment of the memory cell array of FIG. 1.

The spirit of the present disclosure may be applied even when memory cells are two-dimensionally arranged. Referring to FIG. 16, the memory cell array 110 includes a plurality of planar memory blocks PBLK1 to PBLKz. Each of the plurality of planar memory blocks PBLK1 to PBLKz includes first to m-th cell strings CS1 to CSm. The first to m-th cell strings CS1 to CSm are coupled to first to m-th bit lines BL1 to BLm, respectively.

Each of the plurality of cell strings CS1 to CSm includes a source select transistor SST, a plurality of memory cells M1 to Mn coupled in series, and a drain select transistor DST. The source select transistor SST is coupled to a source select line SSL. First to n-th memory cells M1 to Mn are coupled to first to n-th word lines WL1 to WLn, respectively. The drain select transistor DST is coupled to a drain select line DSL. A source side of the source select transistor SST is coupled to a common source line CSL. A drain side of the drain select transistor DST is coupled to a corresponding bit line. The source select line SSL, the first to n-th word lines WL1 to WLn, and the drain select line DSL are included in the row lines RL of FIG. 1. The source select line SSL, the first to n-th word lines WL1 to WLn, and the drain select line DSL are driven by the address decoder 120. The common source line CSL is driven by the common source line controller 130.

In an embodiment, the memory cells are volatile or nonvolatile memory cells.

Figure 17:
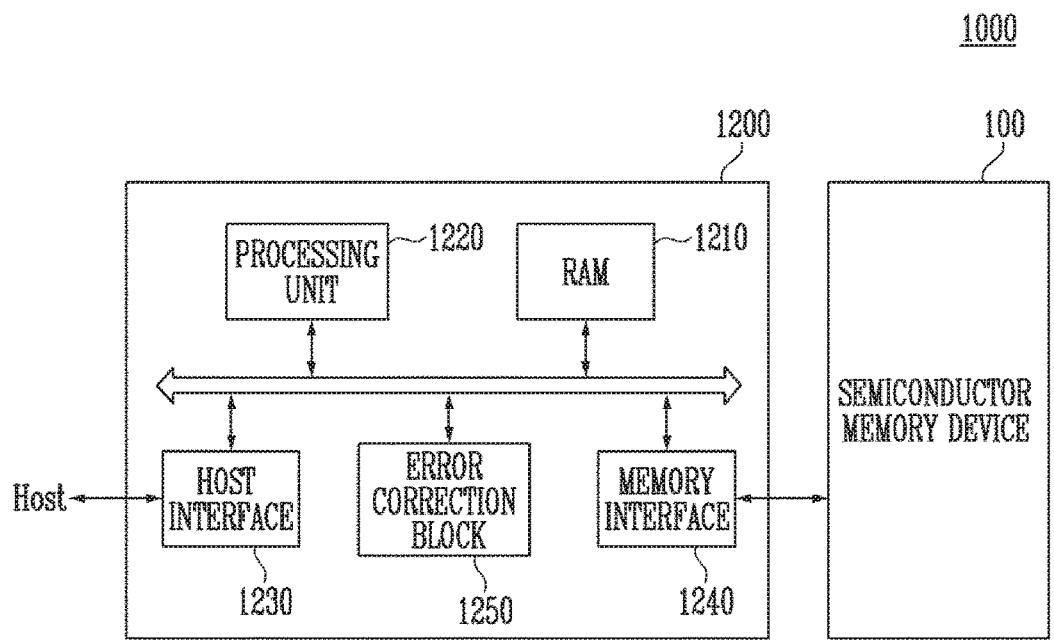
FIG. 17 is a block diagram illustrating a memory system including the semiconductor device of FIG. 1.

FIG. 17 is a block diagram illustrating a memory system 1000 including the semiconductor device 100 of FIG. 1.

Referring to FIG. 17, the memory system 1000 includes a semiconductor device 100 and the controller 1100.

The semiconductor device 100 may be configured and operated as described with reference to FIGS. 1 to 16. Hereinafter, overlapping descriptions will be omitted.

The controller 1200 is coupled to a host Host and the semiconductor device 100. The controller 1200 is configured to access the semiconductor device 100 in response to a request from the host Host. For example, the controller 1200 is configured to control read, write, erase, and background operations of the semiconductor device 100. The controller 1200 is configured to provide an interface between the semiconductor device 100 and the host Host. The controller 1200 is configured to drive firmware for controlling the semiconductor device 100.

The controller 1200 includes a random access memory (RAM) 1210, a processing unit 1220, a host interface 1230, a memory interface 1240, and an error correction block 1250. The RAM 1210 is used as at least one of an operation memory of the processing unit 1220, a cache memory between the semiconductor device 100 and the host Host, and a buffer memory between the semiconductor device 100 and the host Host. The processing unit 1220 controls overall operations of the controller 1200.

The host interface 1230 includes a protocol for exchanging data between the host Host and the controller 1200. As an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the semiconductor device 100. For example, the memory interface 1240 may include a NAND interface or a NOR interface.

The error correction block 1250 is configured to detect and correct an error of data received from the semiconductor device 100 by using an error correction code (ECC).

The controller 1200 and the semiconductor device 100 may be integrated into one semiconductor device. In an exemplary embodiment, the controller 1200 and the semiconductor device 100 may be integrated into one semiconductor device, to constitute a memory card. For example, the controller 1200 and the semiconductor device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the semiconductor device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telemetics network, an RFID device, or one of various components that constitute a computing system.

In an exemplary embodiment, the semiconductor device 100 or the memory system 1000 may be packaged in various forms. For example, the semiconductor device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 18:
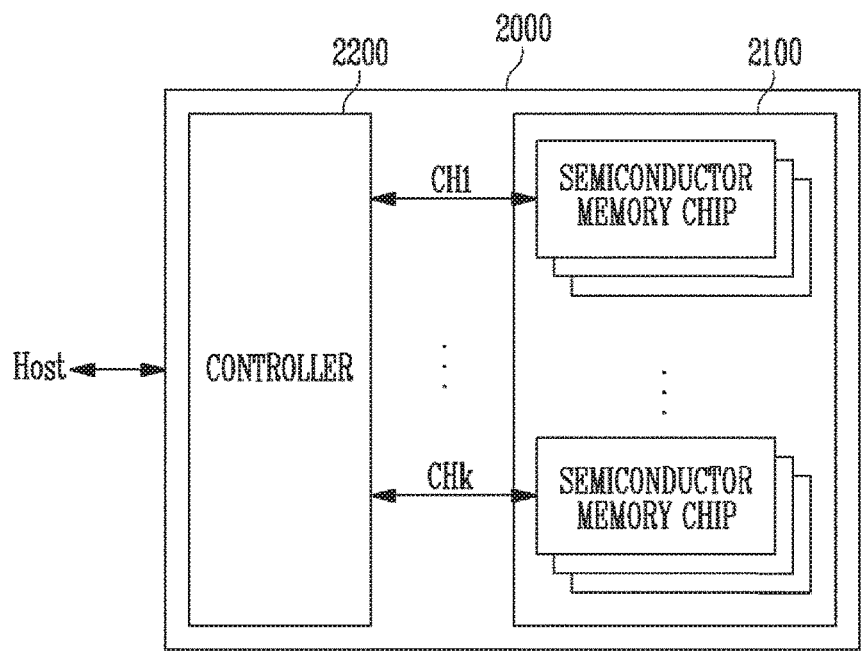
FIG. 18 is a block diagram illustrating an exemplary application of the memory system of FIG. 17.

FIG. 18 is a block diagram illustrating an exemplary application 2000 of the memory system 1000 of FIG. 17.

Referring to FIG. 18, the memory system 2000 includes a semiconductor device 2100 and a controller 2200. The semiconductor device 2100 includes a plurality of semiconductor memory chips. The plurality of semiconductor memory chips are divided into a plurality of groups.

In FIG. 18, it is illustrated that the plurality of groups communicate with the controller 2200 through first to kth channels CH1 to CHk. Each semiconductor memory chip may be configured and operated identically to the semiconductor device 100 described with reference to FIG. 1.

Each group is configured to communicate with the controller 2200 through one common channel. The controller 2200 is configured similarly to the controller 1200 described with reference to FIG. 17. The controller 2200 is configured to control the plurality of memory chips of the semiconductor device 2100 through the plurality of channels CH1 to CHk.

In FIG. 18, it has been illustrated that a plurality of semiconductor memory chips are coupled to one channel. However, it will be understood that the memory system 2000 may be modified such that one semiconductor memory chip is coupled to one channel.

Figure 19:
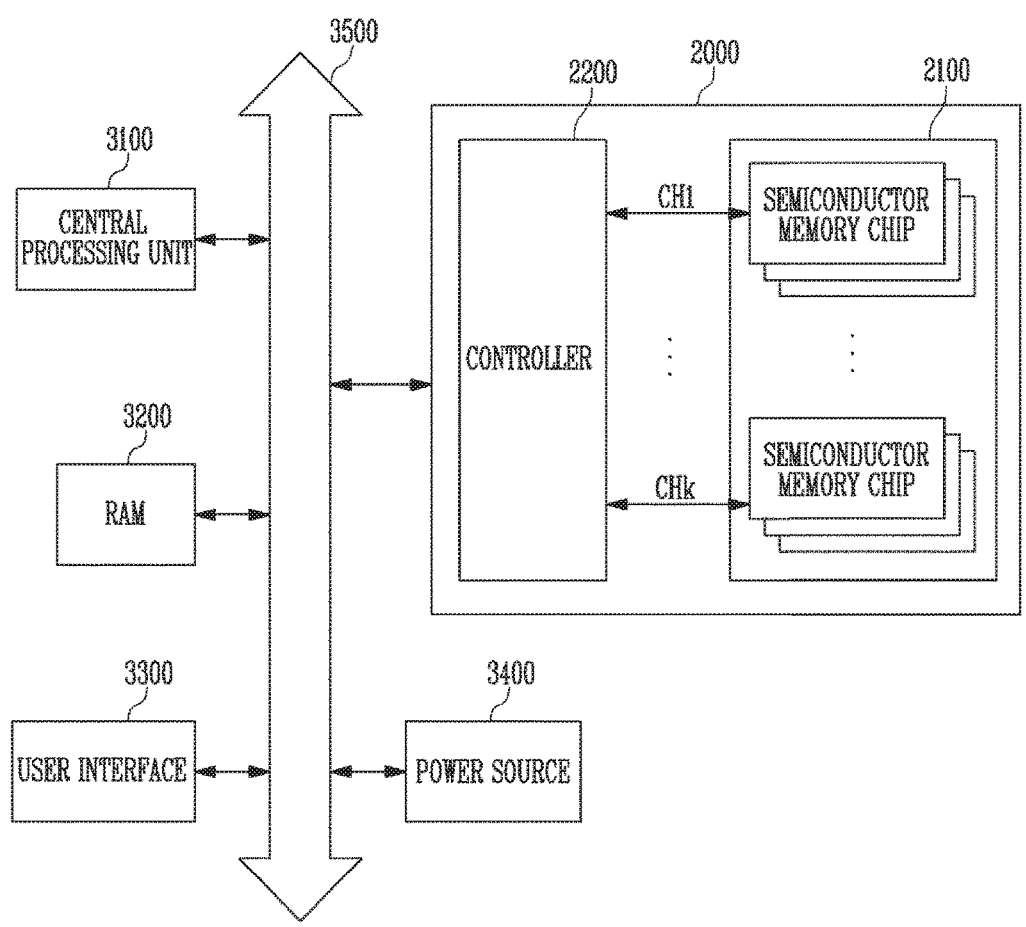
FIG. 19 is a block diagram illustrating a computing system including the memory system described with reference to FIG. 18.

FIG. 19 is a block diagram illustrating a computing system 3000 including the memory system 2000 described with reference to FIG. 18.

Referring to FIG. 19, the computing system 3000 includes a central processing unit 3100, a RAM 3200, a user interface 3300, a power source 3400, a system bus 3500, and the memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 19, it is illustrated that the semiconductor device 2100 is coupled to the system bus 3500 through the controller 2200. However, the semiconductor device 2100 may be directly coupled to the system bus 3500. In this case, the function of the controller 2200 may be performed by the central processing unit 3100 and the RAM 3200.

In FIG. 19, it is illustrated that the memory system 2000 described with reference to FIG. 18 is provided. However, the memory system 2000 may be replaced by the memory system 1000 described with reference to FIG. 17. In an embodiment, the computing system 3000 may be configured to include both the memory systems 1000 and 2000 described with reference to FIGS. 17 and 18.

According to the present disclosure, it is possible to provide a semiconductor device having improved reliability of a read operation.

Further, according to the present disclosure, it is possible to provide a read method of a semiconductor device having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
a cell string including a plurality of memory cells coupled in series between a common source line and a bit line;
a common source line controller configured to provide a channel voltage to the common source line, the bit line being precharged according to a program state of a selected memory cell of the cell string based on the channel voltage transferred through the cell string; and
a page buffer configured to sense data stored in the selected memory cell among the plurality of memory cells.

2. The semiconductor device of claim 1, wherein the buffer page includes:
a bit line sensing transistor coupled between the bit line and a common node;
an emission transistor coupled between the common node and a first power source;
a transmission transistor coupled between the common node and the sensing node; and
a power supply transistor coupled between the sensing node and a second power source,
wherein, while the bit line is being precharged, the transmission transistor and the power supply transistor are turned on in a first turn-on state, the bit line sensing transistor is turned on in a second turn-on state, and the emission transistor is turned off.

3. The semiconductor device of claim 2, wherein, while the bit line is being precharged, the second power source supplies a ground voltage, and the potential of each of the common node and the sensing node is 0V.

4. The semiconductor device of claim 3, wherein, after the bit line is precharged, the emission transistor is turned on in the second turn-on state, the power supply transistor is turned off, and the transmission transistor maintains the first turn-on state.

5. The semiconductor device of claim 4, wherein, as the transmission transistor is turned on in the first turn-on state, a voltage of the common node is transmitted to the sensing node.

6. The semiconductor device of claim 5, wherein the page buffer further includes:
   a sensing transistor having a gate electrode coupled to the sensing node;
   a strobe transistor coupled between a first electrode of the sensing transistor and a third power source; and
   a latch circuit coupled to a second electrode of the sensing transistor.

7. The semiconductor device of claim 6, wherein the strobe transistor is an NMOS transistor, and the third power source is a ground power source.

8. The semiconductor device of claim 6, wherein, in the state in which the voltage of the common node is transmitted to the sensing node, the strobe transistor is turned on in the first turn-on state.

9. The semiconductor device of claim 8, wherein, as the strobe transistor is turned on in the first turn-on state, the data stored in the selected memory cell is transmitted to the latch circuit.

10. The semiconductor device of claim 8, wherein, after the voltage of the common node is transmitted to the sensing node, the transmission transistor is turned off.

11. A method for operating a semiconductor device, the method comprising:
    precharging a bit line according to a program state of a selected memory cell of a cell string by providing a channel current to a channel region of the cell string through a common source line;
    transmitting a voltage of the precharged bit line to a sensing node coupled to a gate electrode of a sensing transistor; and
    storing data of the selected memory cell in a latch circuit, based on the voltage transmitted to the sensing node.

12. The method of claim 11, wherein the precharging of the bit line includes:
    applying a channel voltage having a positive voltage value to the common source line of the cell string; and
    turning on a drain select transistor and a source select transistor of the cell string in a first turn-on state.

13. The method of claim 12, wherein the transmitting of the voltage of the precharged bit line to the sensing node coupled to the gate electrode of the sensing transistor includes:
    turning off a power supply transistor coupled between the sensing node and a terminal of an external power source; and
    increasing a voltage value applied to a gate terminal of a bit line sensing transistor coupled between the bit line and a common node.

14. The method of claim 13, wherein the storing of the data of the selected memory cell in the latch circuit, based on the voltage transmitted to the sensing node, includes:
    turning off a transmission transistor coupled between the sensing node and the common node; and
    turning on a strobe transistor coupled between a first electrode of the sensing transistor having the gate electrode coupled to the sensing node and a ground terminal in the first turn-on state.

15. The method of claim 14, wherein, as the strobe transistor is turned on in the first turn-on state, the data stored in the selected memory cell is transmitted to the latch circuit coupled to a second electrode of the sensing transistor.

* * * * *